(12) United States Patent
Agata et al.

(10) Patent No.: US 6,181,620 B1
(45) Date of Patent: Jan. 30, 2001

(54) SEMICONDUCTOR STORAGE DEVICE

(75) Inventors: Masashi Agata, Osaka; Kazunari Takahashi, Shiga; Tsutomu Fujita, Osaka; Naoki Kuroda, Kyoto; Toshio Yamada, Shiga, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/484,023

(22) Filed: Jan. 18, 2000

(30) Foreign Application Priority Data

Jan. 29, 1999 (JP) .................................................. 11-022499

(51) Int. Cl.[7] .................................................. G11C 11/24
(52) U.S. Cl. .................................................. 365/203
(58) Field of Search .......................................... 365/189.01

(56) References Cited

U.S. PATENT DOCUMENTS

| 5,377,151 | 12/1994 | Komuro . | |
|---|---|---|---|
| 5,636,174 | * 6/1997 | Rao | 365/207 |
| 5,856,940 | 1/1999 | Rao . | |
| 5,923,593 | 7/1999 | Hsu et al. . | |
| 5,963,468 | 10/1999 | Rao . | |
| 5,963,497 | 10/1999 | Holland . | |

* cited by examiner

Primary Examiner—Terrell W. Fears
(74) Attorney, Agent, or Firm—McDermott, Will & Emery

(57) ABSTRACT

The semiconductor storage device of this invention includes memory cells each having two transistors and one storage capacitor. Each memory cell is connected with a first word line and a first bit line for a first port and a second word line and a second bit line for a second port. The first and second bit lines are alternately disposed in an open bit line configuration. In the operation of the semiconductor storage device, in a period when a first precharge signal for precharging each first bit line or a first sense amplifier activating signal for activating a first sense amplifier is kept in an active state, a second precharge signal for precharging each second bit line and a second sense amplifier activating signal for activating a second sense amplifier are both placed in an inactive state.

5 Claims, 7 Drawing Sheets

SEMICONDUCTOR STORAGE DEVICE

BACKGROUND OF THE INVENTION

The present invention relates to a semiconductor storage device including a dynamic random access memory circuit and the like, and more particularly, it relates to a semiconductor storage device comprising memory cells each including two transistors and one storage capacitor.

A low latency DRAM cell of a dual word line and dual bit line system disclosed in U.S. Pat. Nos. 5,856,940, 5,963,468 and 5,963,497, in which each memory cell is provided with two transistors and one storage capacitor and is connected with two word lines and two bit lines, will now be described with reference to a drawing.

FIG. 7 shows the circuit configuration of a memory cell of a semiconductor storage device including the conventional low latency DRAM cell. The memory cell 10 of FIG. 7 includes, for example, a first switch transistor 102 that is connected with a first word line WL0A at its gate, with a first bit line BL0A at its drain and with a storage node 101 at its source; a source switch transistor 103 that is connected with a second word line WL0B at its gate, with a second bit line BL0B at its drain and with the storage node 101 at its source; and a storage capacitor 104 that is connected with the storage node 101 at one electrode and uses a cell plate as the other electrode.

In this manner, the memory cell 100 includes the first switch transistor 102 and the second switch transistor 103 independently controllable with respect to one storage capacitor 104. Accordingly, an interleaving operation can be conducted between a combination of the first word line WL0A and the first bit line BL0A and a combination of the second word line WL0B and the second bit line BL0B all extending over plural memory cells 100, resulting in rapid read and write operations.

In the semiconductor storage device including the conventional low latency DRAM cells, however, the interleaving operation is conducted on bit lines adjacent to each other. Therefore, when first bit lines BLnA and second bit lines BLnB (wherein n is 0 or a larger integer) are operated independently of each other, a coupling noise derived from change of a bit line potential caused during the operation can be disadvantageously introduced into an adjacent bit line. In the worst case, the introduction of such a coupling noise can cause inversion of a data value held by the memory cell 100.

SUMMARY OF THE INVENTION

The invention was devices to overcome the aforementioned conventional problem, and an object of the invention is, in a semiconductor storage device comprising memory cells each including two transistors and one capacitor, preventing an interference noise caused in one bit line from being introduced into an adjacent bit line.

In order to achieve the object, in the semiconductor storage device according to this invention, while a precharge signal or a sense amplifier activating signal of one bit line system is being kept in an active state, a precharge signal or a sense amplifier activating signal of the other bit line system is placed in an inactive state.

Specifically, the semiconductor storage device of this invention comprises plural memory cells each including a first switch transistor and a second switch transistor connected with each other through sources thereof and a storage capacitor for data storage connected with the sources of the transistors at one electrode thereof; plural first bit lines each connected with a drain of the first switch transistor of each of the memory cells; plural second bit lines each connected with a drain of the second switch transistor of each of the memory cells and disposed alternately with the plural first bit lines; plural first sense amplifiers respectively connected with the plural first bit lines; and plural second sense amplifiers respectively connected with the plural second bit lines, and in a period when a first precharge signal for precharging each of the plural first bit lines or a first sense amplifier activating signal for activating each of the plural first sense amplifiers is kept in an active state, a second precharge signal for recharging each of the plural second bit lines and a second sense amplifier activating signal for activating each of the plural second sense amplifiers are both placed in an inactive state.

In the semiconductor storage device of this invention, in the case where a data held in a memory cell is read from, for example, a second bit line, the second precharge signal applied to the second bit line is turned off, and the second switch transistor is then activated, so that charge stored in the storage capacitor can flow into the second bit line. In general, the second sense amplifier is not driven at this point because the second sense amplifier activating signal is in an inactive state. At this point, in the storage device of this invention, the first precharge signal or the first sense amplifier activating signal applied to a first bit line adjacent to the second bit line is kept in an active state. Accordingly, when the first precharge signal is kept at a high level and the first sense amplifier activating signal is kept at a low level, the first bit line is precharged to be placed in a low-impedance state. Therefore, even when the second sense amplifier activating signal thereafter undergoes a low to high transition so as to activate the second sense amplifier, the first bit line in a low-impedance state can work as a shield line.

Furthermore, when the first precharge signal is kept at a low level and the first sense amplifier activating signal is kept at a high level, the potential of the first bit line is defined as a high or low level so as to be place din a low-impedance state. Therefore, even when the second sense amplifier activating signal thereafter undergoes a low to high transition so as to activate the second sense amplifier, the first bit line in a low-impedance state can work as a shield line. As a result, a noise caused in the second bit line whose potential is changed due to a write operation can be prevented from being introduced into the other adjacent second bit line. Thus, the operation of the storage device can be stabilized.

In the semiconductor storage device of this invention, it is preferable that transition of the first sense amplifier activating signal from an active state to an inactive state, transition of the second precharge signal from an active state to an inactive state, and transition of the second sense amplifier activating signal from an inactive state to an active state are triggered in response to an edge of a clock signal for synchronizing operation of the semiconductor storage device. Further, in this case, it is preferable that transition of the first precharge signal from an inactive state to an active state is also triggered in response to the edge of the clock signal. At this point, for example, in a storage device having a configuration where the first precharge signal and the first sense amplifier activating signal are changed at one operation timing of the clock signal for synchronization and the second precharge signal and the second sense amplifier activating signal are changed at the other operating timing of the clock signal, and relative timing of changing the first precharge signal and the second sense amplifier activating signal is shifted when the cycle of the clock signal for synchronization is changed. Therefore, the first precharge signal can be unpreferably changed when the second precharge signal and the second sense amplifier activating signal are in an inactive state. According to the invention, however, since the first precharge signal and the second sense amplifier activating signal are changed at one operation timing of the clock signal for synchronization, the relative timing of changing the first precharge signal and the second sense amplifier activating signal can be avoided from being shifted even when the cycle of the clock signal is changed. Accordingly, the first precharge signal is never changed when the second precharge signal and the second sense amplifier activating signal are in an inactive state. As a result, the first bit lines can definitely keep on working as shield lines.

In the semiconductor storage device of this invention, data stored in the storage capacitor of each of the memory cells is read to a corresponding one of the plural second bit lines preferably when the second precharge signal and the second sense amplifier activating signal are both in an inactive state. In this manner, the potentials of the adjacent first bit lines can be fixed, and hence, an interference noise caused in reading data to an externally selected second bit line can be shielded by the adjacent first bit line.

In the semiconductor storage device of this invention, data to be stored in the storage capacitor of each of the memory cells is written preferably when the second precharge signal and the second sense amplifier activating signal are both in an inactive state. In this manner, an interference noise caused in writing a data to an externally selected second bit line can be shielded by the adjacent first bit line. Furthermore, since a write operation is conducted in a floating state before defining the potentials of the bit lines, time required for defining a read data and, in particular, time required for writing a data value different from the read data value after defining the data can be reduced. Thus, the operation speed can be further increased.

DETAILED DESCRIPTION OF THE INVENTION

Now, a preferred embodiment of the invention will be described with reference to the accompanying drawings.

Figure 1:
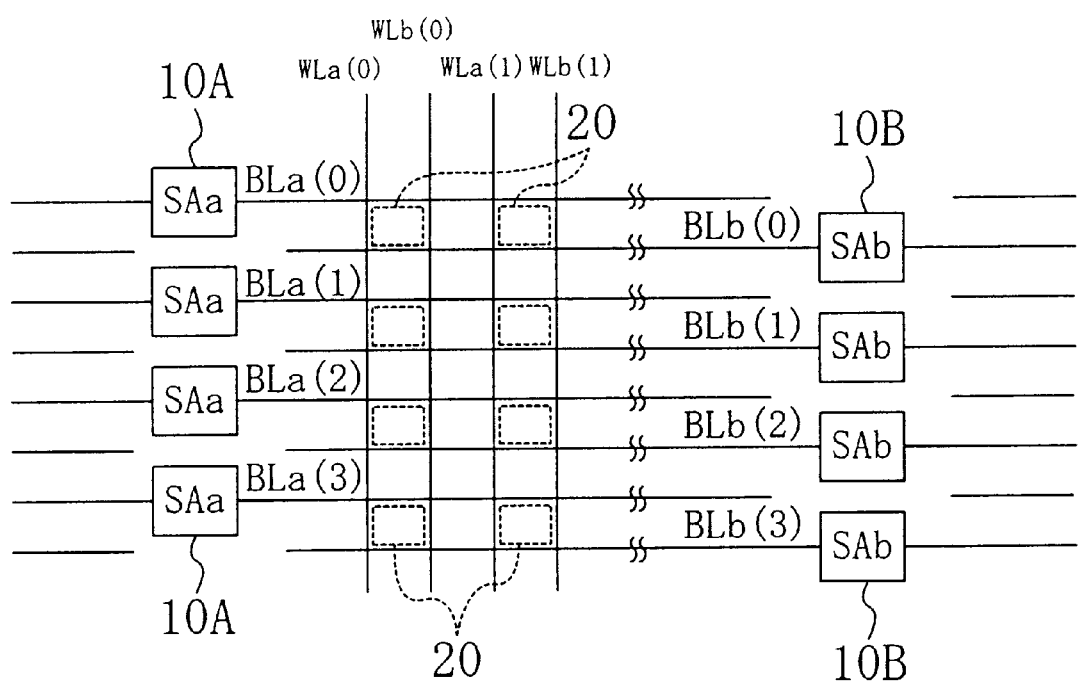
FIG. 1 is a schematic plan view of a memory cell array of a semiconductor storage device according to an embodiment of the invention.

FIG. 1 is a plan view for schematically showing the configuration of a memory cell array used in a semiconductor storage device according to an embodiment of the invention. As is shown in FIG. 1, the storage device of this invention adopts an open bit line configuration in which each sense amplifier SAa or sense amplifier SAb does not have an adjacent complementary bit line pair. Therefore, first bit lines BLa(n) and second bit lines BLb(n) (wherein n=0, 1, 2, etc.) both extending in the row direction are alternatively provided.

At one end of each of the first bit lines BLa(n), a first sense amplifier-related circuit 10A is provided, and at one end of each of the second bit lines BLb(n) opposite to the first sense amplifier-related circuit 10A, a second sense amplifier-related circuit 10B is provided.

Furthermore, first word lines WLa(m) and second word lines WLb(m) (wherein m=0, 1, 2, etc.) respectively crossing the first bit lines BLa(n) and the second bit lines BLb(n) are alternately disposed to extend in the column direction.

As is shown in FIG. 1, a memory cell 20 is provided in an area surrounded with each pair of the first word lines WLa(m) and the second word lines WLb(m) and each pair of the first bit lines BLa(n) and the second bit lines BLb(n). Herein, the memory cell 20 is designated as a 2T1C cell.

Figure 2:
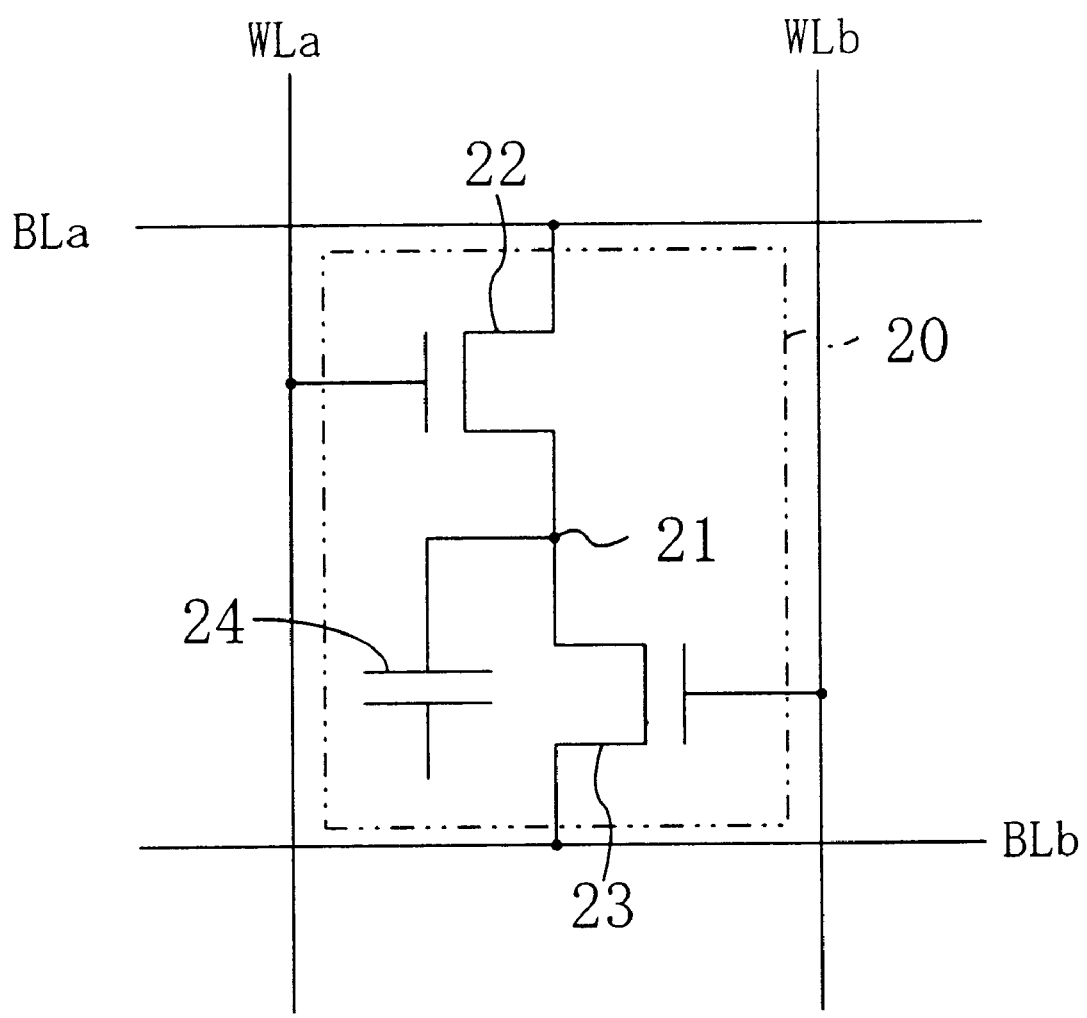
FIG. 2 is a circuit diagram of a memory cell of the semiconductor storage device of the embodiment.

FIG. 2 shows an example of the circuit configuration of the 2T1C cell 20 of this embodiment. As is shown in FIG. 2, the 2T1C cell 20 includes a first switch transistor 22 that is connected with the first word line WLa at its gate, with the first bit line BLa at its drain and with a storage node 21 at its source; a second switch transistor 23 that is connected with the second word line WLb at its gate, with the second bit line BLb at its drain and with the storage node 21 at its source; and a storage capacitor 24 that is connected with the storage node 21 at one electrode and uses a cell plate as the other electrode.

Herein, for the sake of convenience, one system for accessing the 2T1C cells 20 through the first word lines WLa(m) and the first bit lines BLa(n) is designated as a port a, and the other system for accessing the 2T1C cells 20 through the second word lines WLb(m) and the second bit lines BLb(n) is designated as a port b.

Figure 3:
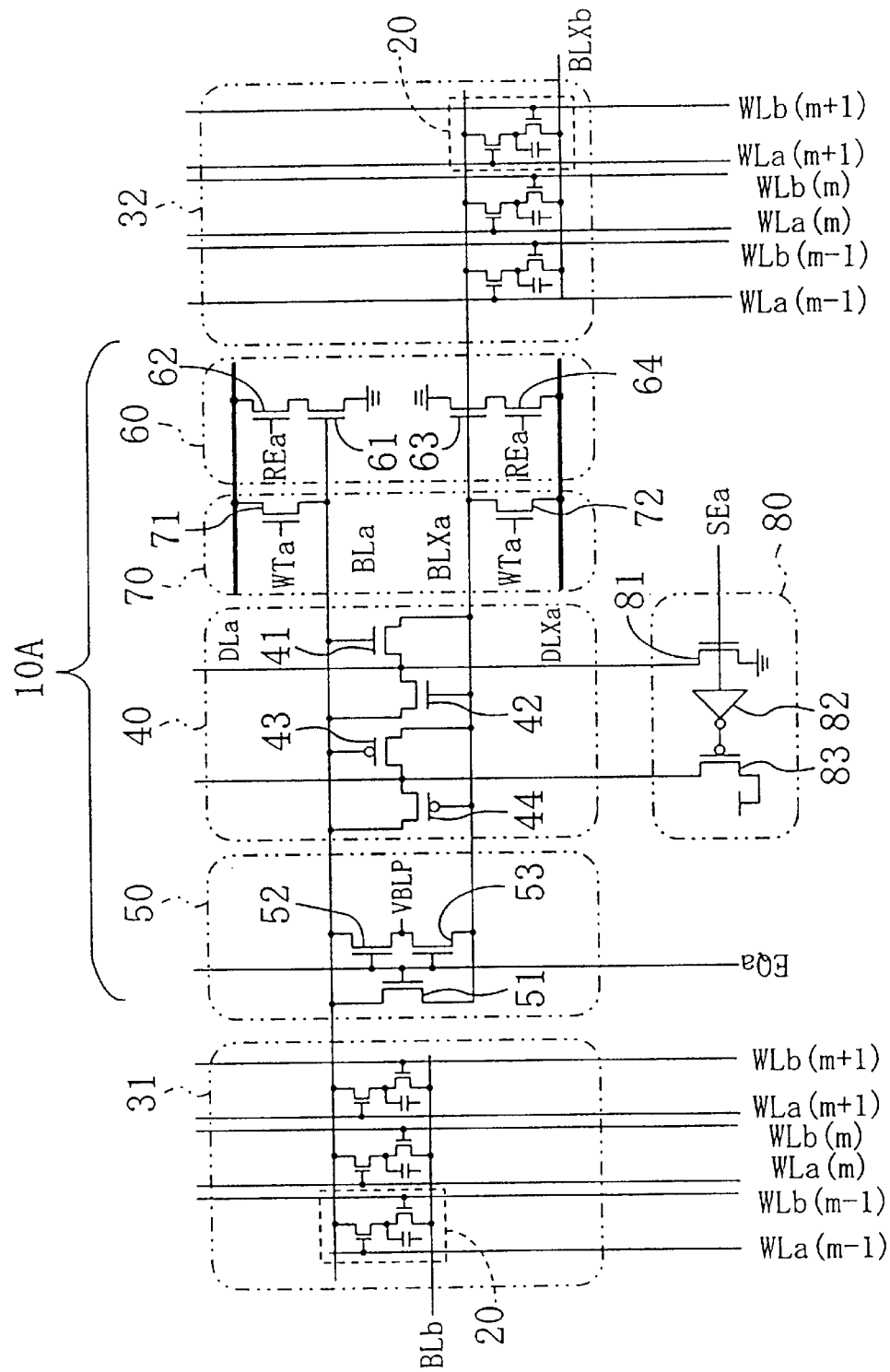
FIG. 3 is a circuit diagram of a sense amplifier-related circuit of the semiconductor storage device of the embodiment.

FIG. 3 shows an example of the detailed circuit configuration of the first sense amplifier-related circuit 10A of FIG. 1. As is shown in FIG. 3, the first sense amplifier-related circuit 10A is a sense amplifier-related circuit for the port a, and is provided with a first memory cell array 31 connected with one first bit line BLa and a second memory cell array 32 connected with the other first bit line BLXa extending from the first sense amplifier-related circuit 10A to the opposite direction to the former first bit line BLa.

The first sense amplifier-related circuit 10A includes a sense amplifier 40 for amplifying a small potential difference caused between the first bit lines BLa and BLXa as a result of read from a selected 2T1C cell 20; a precharge-equalizer 50 disposed between the sense amplifier 40 and the first memory cell array 31 for equalizing the potentials of the first bit lines BLa and BLXa; a direct sense read amplifier 60 disposed between the sense amplifier 40 and the second memory cell array 32 for outputting the potential difference amplified by the sense amplifier 40 as a read data; and a write switch circuit 70 disposed between the sense amplifier 40 and the direct sense read amplifier 60 for writing an externally input data to the first bit lines BLa and BLXa.

The sense amplifier 40 is connected with a sense amplifier driving circuit 80. The sense amplifier driving circuit 80 includes an n-type switch transistor 81 that receives a first sense amplifier activating signal SEa at its gate, is connected with the sense amplifier 40 at its drain and is grounded at its source so as to supply aground potential to the sense amplifier 40; an inverter 82 for outputting an inverted signal obtained by inverting the polarity of the first sense amplifier activating signal SEa; and a p-type switch transistor 83 that receives an output of the inverter 82 at its gate, is connected with the sense amplifier 40 at its drain and is supplied with a supply potential at its source so as to supply the supply potential to the sense amplifier 40.

The sense amplifier 40 includes a first n-type transistor 41 that is connected with the first bit line BLa at its gate, with a ground line from the sense amplifier driving circuit 80 at its source and with the other first bit line BLXa at its drain; a second n-type transistor 42 that is connected with the first bit line BLXa at its gate, with the ground line from the sense amplifier driving circuit 80 at its source and with the other first bit line BLa at its drain; a first p-type transistor 43 that is connected with the first bit line BLa at its gate, with a supply line from the sense amplifier driving circuit 80 at its source and with the other first bit line BLXa at its drain; and a second p-type transistor 44 that is connected with the first bit line BLXa at its gate, with the supply line from the sense amplifier driving circuit 80 at its source and with the other first bit line BLa at its drain.

In this sense amplifier 40, for example, when the first bit line BLa is activated to have a slightly higher potential than the other first bit line BLXa, the first n-type transistor 41 and the second p-type transistor 44 start to be driven. As a result, the first n-type transistor 41 sets the potential of the latter first bit line BLXa at a low level and the second p-type transistor 44 increases the potential of the former first bit line BLa to a high level corresponding to the supply potential. In this manner, the potentials read to the first bit lines BLa and BLXa are defined as a high level and a low level, respectively.

The precharge-equalizer 50 includes an equalize transistor 51 that receives a first precharge signal EQa at its gate and is respectively connected with the first bit lines BLa and BLXa at its source and drain so as to equalize the potentials of the first bit lines BLa and BLXa; a first precharge transistor 52 that receives the first precharge signal EQa at its gate, is connected with the first bit line BLa at its source and is supplied with a precharge supply voltage VBLP at its drain; and a second precharge transistor 53 that receives the first precharge signal EQa at its gate, is connected with the other first bit lint BLXa at its source and is supplied with the precharge supply voltage VBLP at its drain.

The direct sense read amplifier 60 includes a first n-type switch transistor 61 that receives the potential of the first bit line BLa at its gate and is grounded at its source; a second n-type switch transistor 62 that receives a first read control signal REa at its gate, is connected with the drain of the first n-type switch transistor 61 at its source and is connected with a first data line DLa at its drain; a third n-type switch transistor 63 that receives the potential of the other first bit line BLXa at its gate and is grounded at its source; and a fourth n-type switch transistor 64 that receives the first read control signal REa at its gate, is connected with the drain of the third n-type switch transistor 63 at its source and is connected with the other first data line DLXa at its drain.

The write switch circuit 70 includes a first n-type switch transistor 71 that receives a first write control signal WTa having a decode function at its gate and is respectively connected with the first bit line BLa and the first data line DLa at its source and drain; and a second n-type switch transistor 72 that receives the first write control signal WTa at its gate and is respectively connected with the other first bit line BLXa and the other first data line DLXa at its source and drain.

Although the first sense amplifier-related circuit 10A alone is herein described in detail, the second sense amplifier-related circuit 10B for amplifying a small potential difference between the second bit lines BLb and BLXb have an equivalent configuration.

Now, the operation of the semiconductor storage device having the aforementioned configuration with be described with reference to the accompanying drawings.

Figure 4:
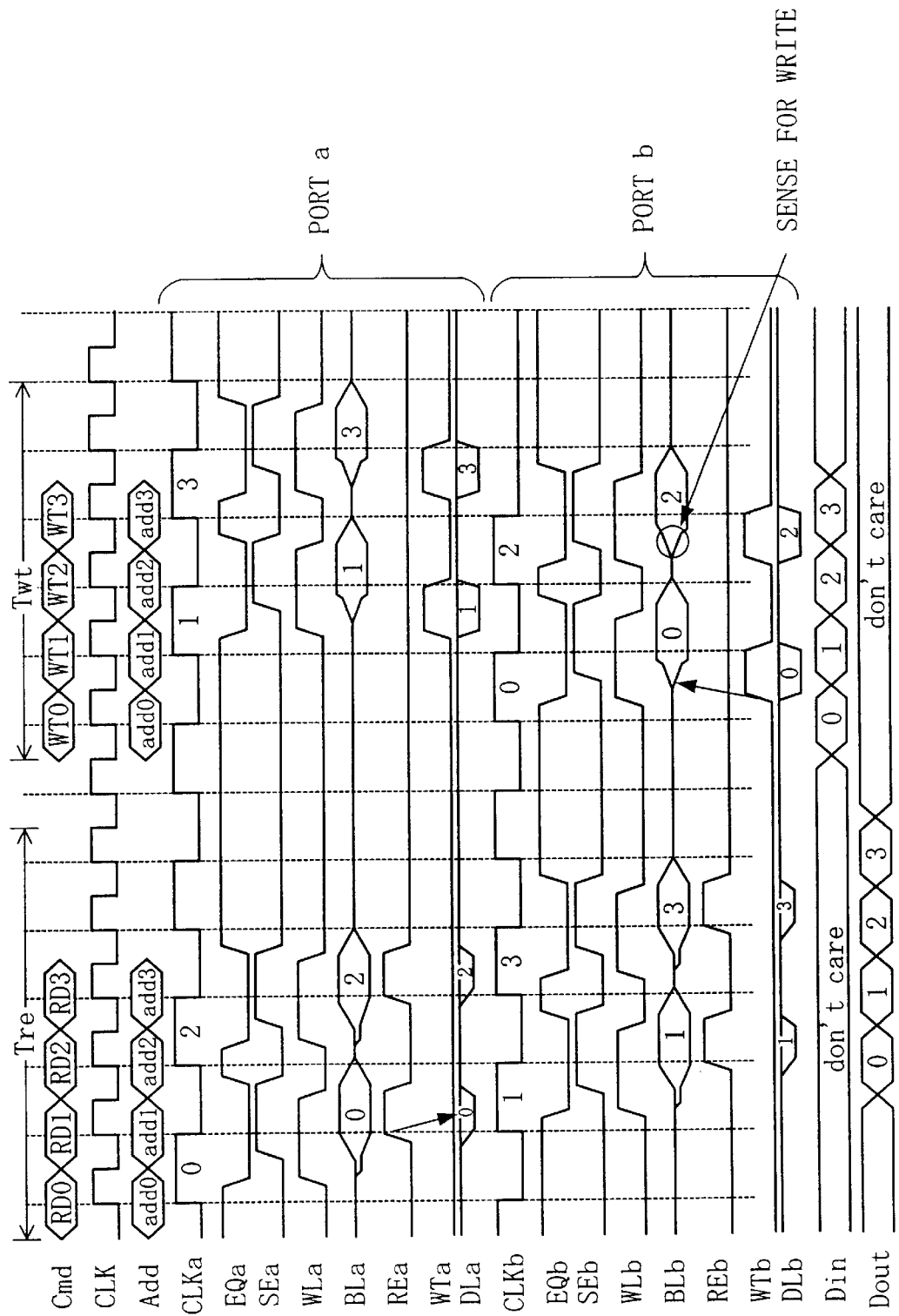
FIG. 4 is a timing chart for showing a read operation and a write operation of the semiconductor storage device of the embodiment.

FIG. 4 shows the operation timing in a read operation and a write operation of the semiconductor storage device of this embodiment.

First, a read operation time Tre shown in FIG. 4 will be described.

As is shown in FIG. 4, the semiconductor storage device receives externally continuously input four read instructions RD0 through RD3 as a command Cmd, and also receives address signals simultaneously input as address signals add0 through add3. This semiconductor storage device is provided with, on the basis of a system clock signal CLK serving as a synchronous signal for the entire device, a first clock signal CLKa for the port a having a cycle twice the cycle of the system clock signal CLK, and a second clock signal CLKb for the port b complementary to the first clock signal CLKa.

In this case, it is assumed, for example, that the port a is accessed by the address signals add0 and add2 and that the port b is accessed by the address signals add1 and add3. Furthermore, it is assumed, in the memory cell array of FIG. 1, that the first word line WLa(0) is selected in accordance with the address signal add0, that the second word line WLb(0) is selected in accordance with the address signal add1, that the first word line WLa(0) is selected in accordance with the address signal add2 and that the second word line WLb(0) is selected in accordance with the address signal add3.

Accordingly, by using, as a trigger, a first rise of the first clock signal CLKa of the port a in the read operation time Tre of FIG. 4, the first precharge signal EQa undergoes an active to inactive transition and the first word line signal WLa undergoes an inactive to active transition. At this point, the first sense amplifier activating signal SEa is in inactive state. Therefore, the first bit lines BLa(n) (wherein n=0, 1, 2, etc.) are placed in a floating state, and the potentials of the first bit lines BLa(n) are slightly changed as a result of movement of charge between the bit lines and the 2T1C cells 20 connected to the selected first word line WLa.

Next, as is shown in FIG. 4, the first sense amplifier activating signal SEa undergoes an inactive to active transition, resulting in activating the sense amplifier driving circuit 80 of FIG. 3. Therefore, the potentials of the first bit lines BLa(n) are defined as a result of the aforementioned operation of the sense amplifier 40.

Subsequently, the first read control signal REa is activated, so as to activate the direct sense read amplifier 60 of FIG. 3. As a result, a read data obtained by inverting the bit line potential is output to the first data line DLa or DLXa.

Then, by using, as a trigger, a first fall of the first clock signal CLKa, the first word line signal WLa undergoes an active to inactive transition, and the first sense amplifier activating signal SEa and the first read control signal REa are successively inactivated. Thus, the access to the first bit lines BLa(n) is completed.

On the other hand, also in the port b, by using, as a trigger, a first rise of the second clock signal CLKb, the second precharge signal EQb undergoes an active to inactive transition and the second word line signal WLb undergoes an inactive to active transition as is shown in FIG. 4. Since the second sense amplifier activating signal SEb is in an inactive state at this point, the second bit lines BLb(n) are placed in a floating state. Therefore, the potentials of the second bit lines BLb(n) are slightly changed as a result of movement of charge between the bit lines and the 2T1C cells 20 connected to the selected second word line WLb.

Next, as is shown in FIG. 4, the second sense amplifier activating signal SEb undergoes an inactive to active transition, so as to define the potentials of the second bit lines BLb(n), and the second read control signal REb is activated, resulting in outputting a read data to the second data line DLb.

Subsequently, the second word line signal WLb undergoes an active to inactive transition, and the second sense amplifier activating signal SEb and the second read control signal REb are successively inactivated. Thus, the access to the second bit lines BLb(n) is completed.

Then, by using, as a trigger, a next rise of the first clock signal CLKa shown in FIG. 4, the first precharge signal EQa undergoes an active to inactive transition and the first word line signal WLa undergoes an inactive to active transition again. Since the first sense amplifier activating signal SEa is in an inactive state at this point, the first bit lines BLa(n) are placed in a floating state. Therefore, the potentials of the first bit lines BLa(n) are slightly changed as a result of movement of charge between the bit lines and the 2T1C cells 20 connected to the selected first word line WLa. Subsequently, the first sense amplifier activating signal SEa undergoes an inactive to active transition, so as to define the potentials of the first bit lines BLb(n). At this point, in the second bit lines BLb(n) of the port b, the second precharge signal EQb is in an inactive state at a low level, and the second sense amplifier activating signal SEb is kept in an active state at a high level. Therefore, the second bit lines BLb(n) are in a low-impedance (Lo-Z) state.

In this manner, this embodiment is characterized by the following: In the read operation time Tre, during a period when the port a is selected and the first bit lines BLa(n) are in a floating state with both the first precharge signal EQa and the first sense amplifier activating signal SEa placed in an inactive state, and during a period from this floating state to activation of the sense amplifier 40, the second precharge signal EQb is kept in an active state at a high level and the second sense amplifier activating signal SEb is kept in an inactive state at a low level in the port b. Accordingly, the second bit lines BLb(n) of the port b shown in FIG. 1 are kept at the precharge potential VBLP to be placed in a low-impedance state, and the potential of a second bit line BLb adjacent to a first bit line BLa in a floating state is fixed to the precharge potential VBLP. Thus, interference of the second bit line BLb with the first bit line BLa can be prevented.

Furthermore, in the case where the port a is selected at a next rise of the first clock signal CLKa in the read operation time Tre, during a period when the first bit lines BLa(n) are in a floating state with both the first precharge signal EQa and the first sense amplifier activating signal SEa placed in an inactive state, and during a period from this floating state to activation of the sense amplifier, the second precharge signal EQb is kept in an inactive state at a low level and the second sense amplifier activating signal SEb is kept in an active state at a high level in the port b. Accordingly, the second bit lines BLb(n) shown in FIG. 1 are placed in a low-impedance state by the sense amplifier in an active state, and the potential of a second bit line BLb adjacent to a first bit line BLa in a floating state is fixed to a high or low level. Thus, the interference of the second bit line BLb with the first bit line BLa can be prevented.

It goes without saying that interference of the first bit line BLa of the port a with the second bit line BLb of the port b can be similarly prevented by changing the order of reading the ports a and b.

Now, a write operation time Twt of FIG. 4 will be described.

As is shown in FIG. 4, the storage device receives externally continuously input four write instructions WT0 through WT3 as commands Cmd, and also receives address signals simultaneously input as address signals add0 through add3.

It is herein assumed that the port a is accessed by the address signals add0 and add2 and that the port b is accessed by the address signals add1 and add3. Furthermore, it is also assumed, in the memory cell array of FIG. 1, that the first word line WLa(0) is selected in accordance with the address signal add0, that the second word line WLb(0) is selected in accordance with the address signal add1, that the first word line WLa(0) is selected in accordance with the address signal add2, and that the second word line WLb(0) is selected in accordance with the address signal add3.

By using, as a trigger, a first rise of the second clock signal CLKb of the port b in the write operation time Twt shown in FIG. 4, the second precharge signal EQb undergoes an active in inactive transition, and the second word line signal WLb and the second write control signal WTb undergo an inactive to active transition. At this point, the second sense amplifier activating signal SEb is in an inactive state, and hence, the second bit lines BLb(n) are placed in a floating state. At this point, in this embodiment, differently from a write operation in a general DRAM, an externally input data Din0 is input through the second data line DLb to the second bit line BLb(0) selected by the second write control signal WTb during this floating state before defining the potentials of the bit lines. Accordingly, time generally required for defining a read data and time required for writing a data after defining the data, in particular, writing a data value different from the read data value, namely, time required for the so-called inversion write, can be reduced, resulting in easily realizing a rapid write operation. Furthermore, since the inversion write can be thus avoided, the driving ability of a circuit for data write can be reduced, resulting an decreasing the circuit scale and power consumption of the circuit for data write.

Subsequently, the second sense amplifier activating signal SEb is activated, so as to define the potentials of the second bit lines BLb(n), and the second word line signal WLb is inactivated, so as to define an input data value of the storage capacitor 21 of the 2T1C cell 20.

Next, the second word line signal WLb undergoes an active to inactive transition and the second sense amplifier activating signal SEb is successively inactivated. Thus, the access to the second bit line BLb(0) is completed.

On the other hand, by using, as a trigger, a first rise of the first clock signal CLKa of the port a in the write operation time Twt, the first precharge signal EQa undergoes an active to inactive transition, and the first word line signal WLa and the first write control signal WTa undergo an inactive to active transition. Since the first sense amplifier activating signal SEa is in inactive state at this point, the first bit lines BLa(n) are placed in a floating state, and an externally input data Din1 is input through the first data line DLa to the first bit line BLa(1) selected by the first write control signal WTa. Subsequently, the first sense amplifier activating signal SEa is activated, so as to define the potentials of the first bit lines BLa(n).

At this point, in the second bit lines BLb(n) of the port b, the second precharge signal EQb is in an inactive state at a low level, and the second sense amplifier activating signal SEb is kept in an active state at a high level. Therefore, the second bit lines BLb(n) are placed in a low-impedance state, and the precharge operation in the port b is not started yet.

In this manner, this embodiment is further characterized by the following: In the write operation time Twt, during a period when the port b is selected and the second bit lines BLb(n) are in a floating state with both the second precharge signal EQb and the second sense amplifier activating signal SEb placed in an inactive state, and during a period from this floating state to activation of the sense amplifier, the first precharge signal EQa is kept in an active state at a high level and the first sense amplifier activating signal SEa is kept in an inactive state at a low level in the port a. Accordingly, the first bit lines BLa(n) of the port a shown in FIG. 1 are kept at the precharge potential VBLP to be placed in a low-impedance state, and hence the first bit lines BLa(n) work as shield lines. Therefore, even when the write operation causes large potential change in the second bit line BLb(0) of the port b selected by the second write control signal WTb, interference with the adjacent unselected second bit line BLb(1) of the port can be prevented.

Furthermore, in the case where the port a is selected at a first rise of the first clock signal CLKa in the write operation time Twt, during a period when the first bit lines BLa(n) are in a floating state with both the first precharge signal EQa and the first sense amplifier activating signal SEa placed in an inactive state, and during a period from this floating state to activation of the sense amplifier, the second precharge signal EQb is kept in an inactive state at a low level and the second sense amplifier activating signal SEb is kept in an active state at a high level in the port b. Accordingly, the second bit lines BLb(n) of FIG. 1 are placed in a low-impedance state by the sense amplifier in an active state, and hence, the second bit lines BLb(n) work as shield lines. Therefore, even when the write operation causes large potential change in the first bit line BLa(1) of the port a selected by the first write control signal WTa, interference with the adjacent unselected first bit line BLa(0) of the port a can be prevented.

Figure 5:
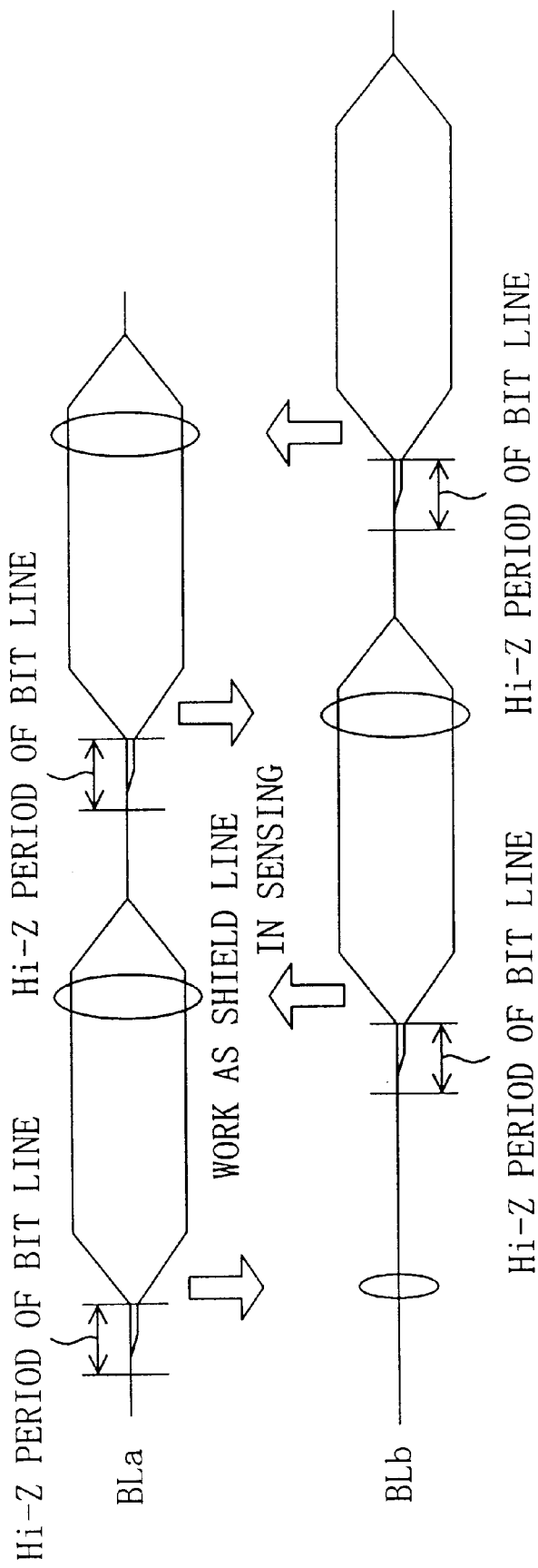
FIG. 5 is a timing chart for schematically showing potential change in bit lines of the semiconductor storage device of the embodiment.

As described so far, the semiconductor storage device including the 2T1C cells of this embodiment is operated as follows as is shown in a timing chart of FIG. 5 for showing potential change in bit lines BLa and BLb of the ports a and b: With respect to, for example, the port a, during a period of a floating state (namely, a high-impedance state) where the first precharge signal EQa and the first sense amplifier activating signal SEa of the port are both in an inactive state and a subsequent period when the first sense amplifier activating signal SEa is activated, the active state of the second precharge signal EQb and the inactive state of the second sense amplifier activating signal SEb are kept, or the inactive state of the second precharge signal EQb and the active state of the second sense amplifier activating signal SEb are kept in the port b.

Accordingly, owing to the layout structure in which the first bit line BLa of the port a and the second bit line BLb of the port b are alternately disposed, when the first bit line BLa is in a high-impedance sate, the adjacent second bit line BLb is always in a low-impedance state, and the potential of the second bit line BLb is fixed. Therefore, the interference with the adjacent first bit line BLa can be prevented. Furthermore, in a write operation, the second bit line BLb works as a shield line for the first bit line BLa whose potential is largely changed due to the write operation, and hence, the interference between the first bit lines BLa, for example, between BLa(0) and BLa(1), can be prevented.

Figure 6:
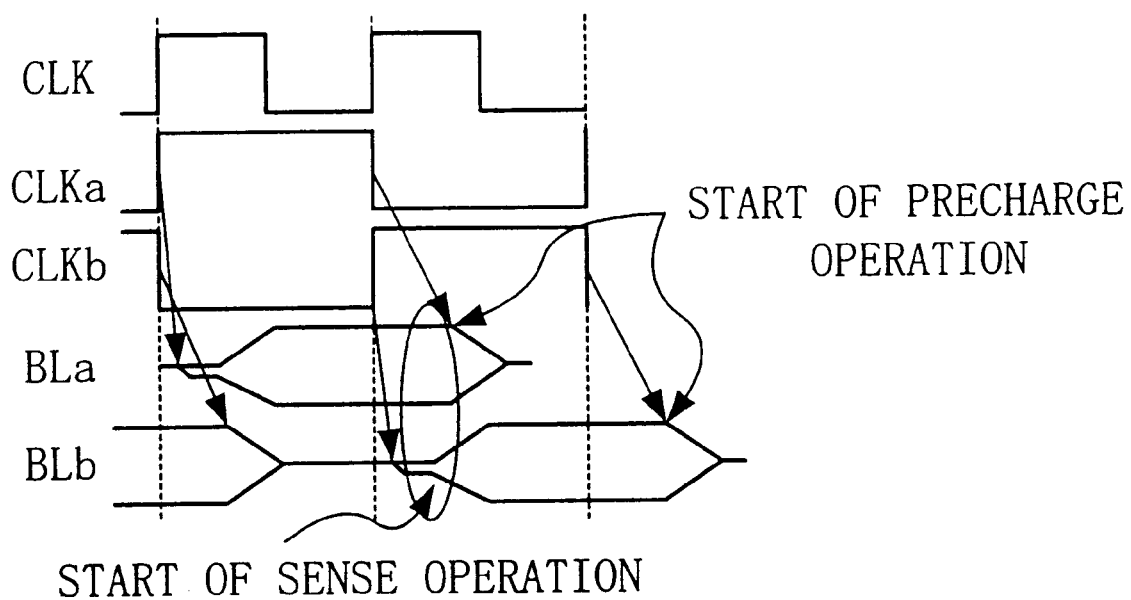
FIG. 6 is a timing chart for schematically showing change of clock signals and bit line potentials in the semiconductor storage device of the embodiment.
Figure 7:
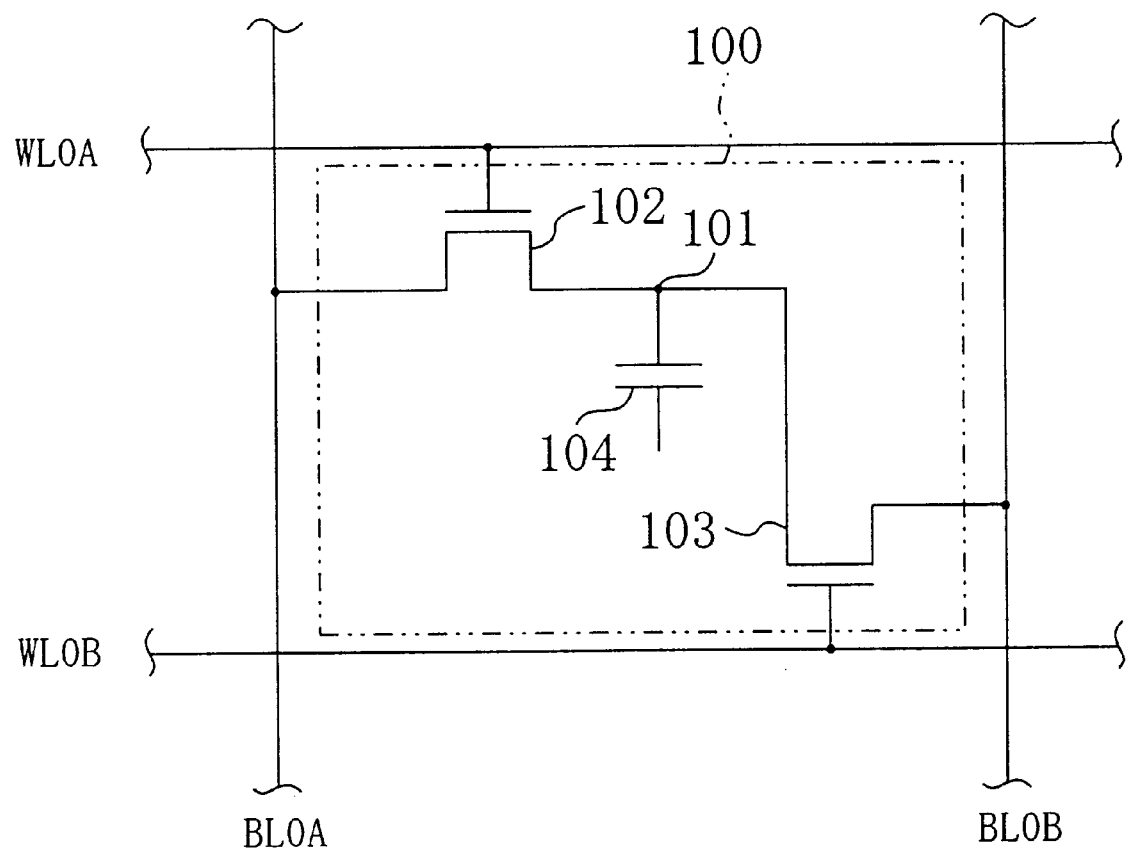
FIG. 7 is a circuit diagram of a memory cell of a semiconductor storage device including a conventional low latency DRAM cell.

Furthermore, the semiconductor storage device of this embodiment is provided with, on the basis of the system clock signal CLK, the first clock signal CLKa for the port a and the second clock signal CLKb for the port b obtained by inverting the first clock signal CLKa as is shown in a timing chart of FIG. 6 for showing change of the respective clock signals and the bit line potentials of the respective ports. In this semiconductor storage device, the precharge operation is started on the basis of transition to an active state of the first precharge signal EQa triggered by a fall edge of the first clock signal CLKa, and the sense operation is started on the basis of transition to an active state of the second sense amplifier activating signal SEb triggered by a rise edge of the second clock signal CLKb occurring at the same timing as the fall edge of the first clock signal CLKa.

For example, in the case where the port a uses merely a rise edge of the first clock signal CLKa as a trigger for the first precharge signal EQa and the first sense amplifier activating signal SEa and the port b uses merely a rise edge of the second clock signal CLKb as a trigger for the second precharge signal EQb and the second sense amplifier activating signal SEb, a floating period of the second bit line BLb of the port b and a transition period for a precharge operation of the first bit line BLa of the port a shown in FIG. 6 can overlap each other when the operation cycle of the system clock signal CLK is changed.

In this embodiment, however, the first precharge signal EQa of the port a and the second sense amplifier activating signal SEb of the port b, and the second precharge signal EQb of the port b and the first sense amplifier activating signal SEa of the port a are changed by using one edge of the system clock signal CLK as a trigger. Therefore, even when the operation cycle of the system clock signal CLK is changed, it is possible to prevent, for example, a floating period of the second bit line BLb of the port b from overlapping a transition period for a precharge operation of the first bit line BLa of the port a.

The circuit configurations of the sense amplifier 40, the precharge-equalizer 50, the direct sense read amplifier 60, the write switch circuit 70 and the sense amplifier driving circuit 80 included in the first sense amplifier-related circuit 10A are not limited to those shown in FIG. 3 but these circuits can be realized by any circuit configuration having an equivalent function.

What is claimed is:

1. A semiconductor storage device comprising:
   plural memory cells each including a first switch transistor and a second switch transistor connected with each other through sources thereof and a storage capacitor for data storage connected with said sources of said transistors at one electrode thereof;
   plural first bit lines each connected with a drain of said first switch transistor of each of said memory cells;
   plural second bit lines each connected with a drain of said second switch transistor of each of said memory cells and disposed alternately with said plural first bit lines;
   plural first sense amplifiers respectively connected with said plural first bit lines; and
   plural second sense amplifiers respectively connected with said plural second bit lines, wherein, within a period when a first precharge signal for precharging each of said plural first bit lines or a first sense amplifier activating signal for activating each of said plural firs sense amplifiers is kept in an active state, a second precharge signal for precharging each of said plural second bit lines and a second sense amplifier activating signal for activating each of said plural second sense amplifiers are both placed in an inactive state.

2. The semiconductor storage device of claim 1, wherein transition of said first sense amplifier activating signal from an active state to an inactive state, transition of said second precharge signal from an active state to an inactive state, and transition of said second sense amplifier activating signal from an inactive state to an active state are triggered in response to an edge of a clock signal for synchronizing operation of said semiconductor storage device.

3. The semiconductor storage device of claim 2, wherein transition of said first precharge signal from an inactive state to an active state is also triggered in response to said edge of said clock signal.

4. The semiconductor storage device of claim 1, wherein data stored in said storage capacitor of each of said memory cells i read to a corresponding one of said plural second bit lines when said second precharge signal and said second sense amplifier activating signal are both in an inactive state.

5. The semiconductor storage device of claim 1, wherein data to be stored in said storage capacitor of each of said memory cells is written when said second precharge signal and said second sense amplifier activating signal are both in an inactive state.

* * * * *